United States Patent [19]

Rogers

[11] 4,059,826
[45] Nov. 22, 1977

[54] SEMICONDUCTOR MEMORY ARRAY WITH FIELD EFFECT TRANSISTORS PROGRAMMABLE BY ALTERATION OF THRESHOLD VOLTAGE

[75] Inventor: Gerald D. Rogers, Houston, Tex.

[73] Assignee: Texas Instruments Incorporated, Dallas, Tex.

[21] Appl. No.: 645,173

[22] Filed: Dec. 29, 1975

[51] Int. Cl.² .................... G11C 11/40; G11C 17/00
[52] U.S. Cl. ................... 365/104; 340/166 R; 357/91; 365/178
[58] Field of Search ......... 340/173 R, 173 SP, 166 R; 357/91, 45

[56] References Cited
U.S. PATENT DOCUMENTS

| 3,865,651 | 2/1975 | Arita | 357/45 |
| 3,876,991 | 4/1975 | Nelson et al. | 340/173 R |
| 3,914,855 | 10/1975 | Cheney et al. | 357/45 |

OTHER PUBLICATIONS

Grochowski, Rewritable IGFET Read-Only Store, IBM Technical Disclosure Bulletin, vol. 14, No. 1, 6/71, p. 263.

Terman, FET Memory Systems, IEEE Transactions on Magnetics, vol. Mag-6, No. 3, 9/70, pp. 584–589, s 145 7 0017.

Daughton, 256-Bit Chip for 128-Bit Latent Image Store, IBM Technical Disclosure Bulletin, vol. 15, No. 1, 6/72, p. 270, s2800-0256.

Primary Examiner—Stuart N. Hecker
Attorney, Agent, or Firm—James T. Comfort; John G. Graham

[57] ABSTRACT

N-channel silicon gate MOS memory cells are programmed by an ion implant step which is done prior to forming the gates or the diffused source and drain regions. The implanted devices have a threshold voltage which is about zero, so the devices cannot be turned off at usual logic levels. Either ROM or RAM arrays can be made using implant for programming.

9 Claims, 5 Drawing Figures

SEMICONDUCTOR MEMORY ARRAY WITH FIELD EFFECT TRANSISTORS PROGRAMMABLE BY ALTERATION OF THRESHOLD VOLTAGE

INTRODUCTION

This invention relates to semiconductor memory devices, and more particularly to N-channel MOS read-only-memory (ROM) devices as well as methods of manufacturing such devices.

BACKGROUND OF THE INVENTION

Metal-oxide-semiconductor or MOS ROM's have been traditionally manufactured, in P-channel form, by selectively thinning the oxide at the locations of potential MOS transistors in the manner set forth in U.S. Pat. No. 3,541,543, issued Nov. 11, 1970, to Crawford, assigned to Texas Instruments. The technique has proved very useful in large volume low-cost manufacture of ROM's because all of the process steps and masks, except one, are exactly the same regardless of the code programmed into the individual ROM. The gate level mask is the only mask which is unique to a given code.

It has become increasingly necessary to employ N-channel silicon gate MOS devices in memory and logic systems because of the advantage in operation speed or access time. However, the coding technique of U.S. Pat. No. 3,541,543 is not appropriate for use in the N-channel manufacturing process because the process steps are quite different from the P-channel process.

It is therefore an object of this invention to provide improved N-channel silicon gate ROM devices and method of manufacture thereof. Another object is to provide a method of programming ROM devices in a manner compatible with N-channel silicon gate processing. An additional object is to provide a method of programming N-channel silicon gate ROM devices wherein a minimum of mask changes is needed.

SUMMARY OF THE INVENTION

In accordance with one embodiment of the invention, a ROM is constructed wherein the output lines or Y lines are in an AND or NAND logic configuration instead of the usual OR or NOR configuration. According to another feature of the invention, all of the channel regions where a gate is not to exist are shorted by a selective or masked ion implant step. This implant step is performed prior to the time when gate oxide is grown, which is prior to deposition of the silicon gates. All of the steps following the implant steps are the same, regardless of the gate code, so all of the photomasks used are identical except that which generates the implant mask. This concept of employing ion implant to short out or negate logic elements in an N-channel silicon gate MOS device may of course be of use in circuitry other than ROM's.

THE DRAWINGS

The novel feature believed characteristic of the invention are set forth with particularity in the appended claims; the invention itself, however, as well as further objects and advantages thereof, will best be understood by reference to the following detailed description of particular embodiments when read in conjunction with the accompanying drawings, wherein:

DETAILED DESCRIPTION OF SPECIFIC EMBODIMENT

Figure 1:
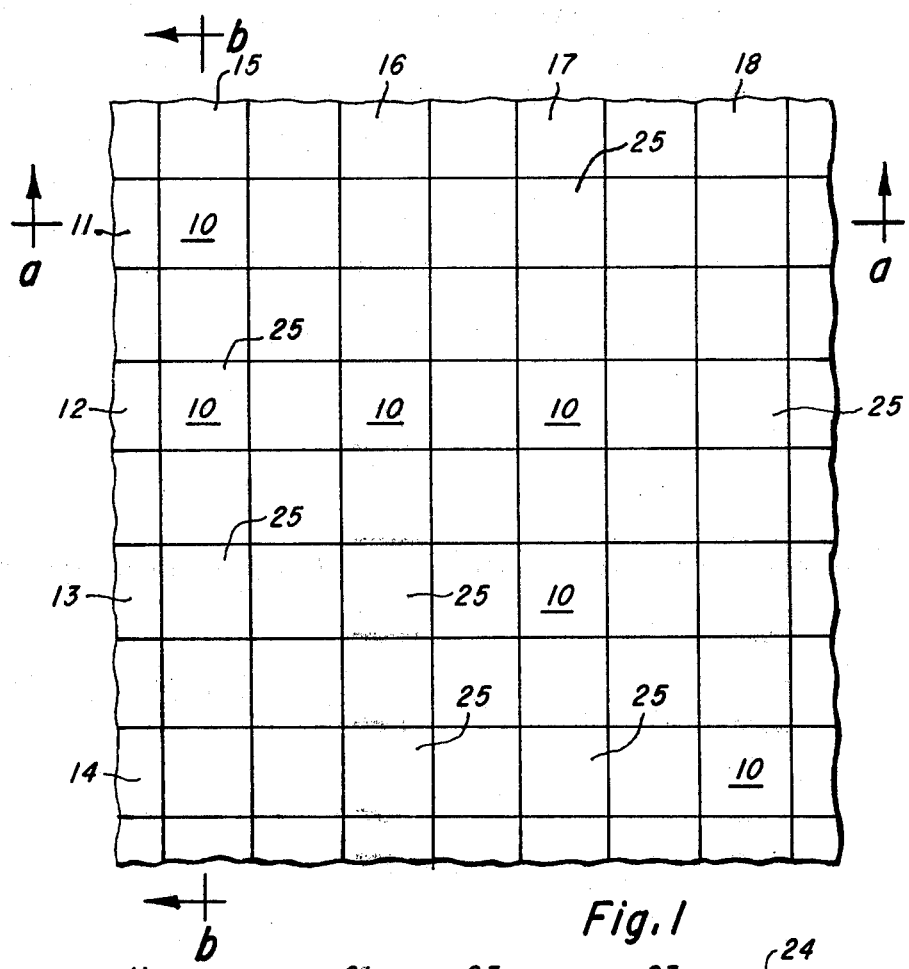
FIG. 1 is a plan view of a part of a semiconductor integrated circuit chip employing the invention.
Figure 2A:
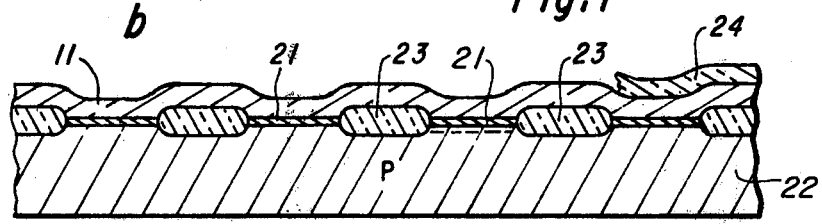
FIG. 2a is a section view of the integrated circuit chip of FIG. 1, taken along the line a—a in FIG. 1.
Figure 2B:
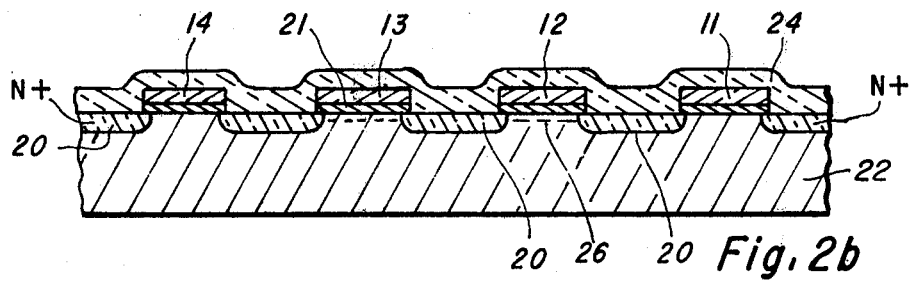
FIG. 2b is a section view of the integrated circuit chip of FIG. 1, taken along the line b—b in FIG. 1.

Referring to FIG. 1, an N-channel ROM according to the invention is illustrated. Only sixteen memory cells 10 are shown, although it is understood that a typical ROM would contain perhaps 4096, 8192, or 16384 (or some other large power of 2) cells. The ROM includes X address lines 11, 12, 13, and 14 and Y output lines 15, 16, 17, and 18. Each of the X address lines consists of a strip of polycrystalline silicon which is doped so that it is conductive. The Y lines consist of alternate N+ diffused regions 20 and thin oxide gate-like regions 21 across which pass the X address lines, as seen in FIGS. 2a and 2b. The structure can best be understood by reviewing the process for making the devices.

The starting material for the devices of FIG. 1 and FIGS. 2a and 2b is a slice of P-type monocrystalline silicon of perhaps 3 inch diameter and 50 mils thick. Of this slice, the bar 22 shown in the figures in only a very small part; the part seen would be only a few mils in width. Also, the vertical dimensions are exaggerated. The layers to be described are only 1,000 or 10,000 A thick, whereas the bar 22 is perhaps 5 mils wide (1 mil = 254,000 A).

The first step is coating the slice with a thin silicon oxide film, about 1000 A, by exposing to steam at a temperature of about 900° C. A silicon nitride film is deposited over the oxide, using a conventional technique wherein silane and amonia are fed into an rf plasma reactor containing the slice. The nitride film is also about 1000 A in thickness. The nitride film is patterned using photoresist, and nitride is removed by an etchant which does not attack the oxide, to leave covered a pattern including the strips 15-17 and to expose intervening areas where field oxide 23 is to be grown. The slice is subjected to an ion implant step after growing field oxide 23 and it is at this point that the ROM code is determined, according to the invention. Next, the slice is placed in a furnace at about 900° C for several hours to grow the field oxide 23 to a thickness of about 10,000 A. The surface of the silicon is consumed as the oxide grows, so the field oxide seems to extend into the face of the silicon, this depth being about 5,000 A. The nitride film masks growth of oxide beneath it. The nitride and oxide films are removed by etching, and the slice is selectively implanted. Next, thin oxide is regrown to create the gate region 21. The slice is then covered with a layer of polycrystalline silicon, and this layer is patterned by photoresist masking and etching to create the strips 11-14. The slice is next subjected to an N+ diffusion operation which creates the N+ diffused regions 20 and lowers the resistance of the polysilicon strips 11-14. The oxide layers 21 and 23 mask the diffusion in other parts of the face of the slice. The entire slice is next covered by a protective oxide layer 24 which covers all of the strips 11-18.

The device would be completed by scribing, breaking into individual chips of a size of about 150 to 200 mils on a side, packaging and testing. Each chip would contain an array of ROM cells 10 of perhaps 4096 as mentioned above, along with decode circuits, input/output buffers and the like as is well known in the industry. Of course, the ROM could be a part of a more complex system such as a calculator chip or microprocessor as shown in U.S. Pat. No. 3,892,957 to Bryant or pending application Ser. No. 525,237 filed Nov. 19, 1974 to J. H. Raymond, now U.S. Pat. No. 3,991,305, issued Nov. 9, 1976, assigned to Texas Instruments.

Figure 3:
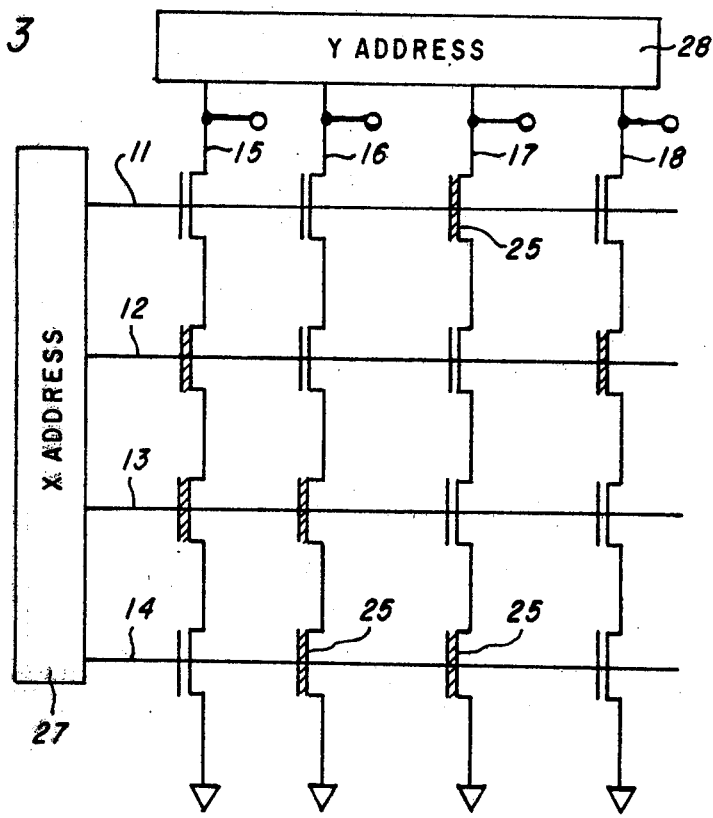
FIG. 3 is an electrical schematic diagram of the device of FIG. 1.

In the example of FIG. 1, as shown in schematic diagram form in FIG. 3, certain of the cells 10 are programmed to be logic "1" and others logic "0". For example, the cells 25 will be assumed to be "0". These devices will be in a condition whereby they cannot be turned off or rendered non-conductive, and this is accomplished by the ion implant step mentioned above. The mask used to define a pattern in the photoresist at this point leaves holes over the gate regions for cells 25, but all of the other gate regions remain covered as well as the remainder of the slice. Phosphorus is implanted at a dosage of about $1 \times 10^{12}$ atoms/cm$^2$ at about 150 KeV. This produces a situation very much like that used for depletion load MOS devices. At zero gate voltage the device is conductive; a negative voltage is needed to cut off the device, but in the circuit of FIG. 3 a negative voltage does not occur on the gate, so the device is always conductive. The implanted cells in effect have a permanent channel region 26 beneath the gate created by the implant.

In operation of the circuit of FIG. 3, a decode or X address circuit 27 would select one of the lines 11-14 as the addressed line; this selected line is maintained at logic zero or Vss (ground) while all of the non-selected lines are held at Vdd or logic one, for example +12 v. Similarly, Y address circuitry 28 selects one of the four lines 15-18, the unselected lines remaining open circuited. The selected line is connected to a load transistor. The output across the load will be a zero if the selected bit is a zero because it will be shorted to Vss through a device 25. The output will be a one if the selected bit is a one as the transistor 10 of this bit will be non-conductive.

Figure 4:
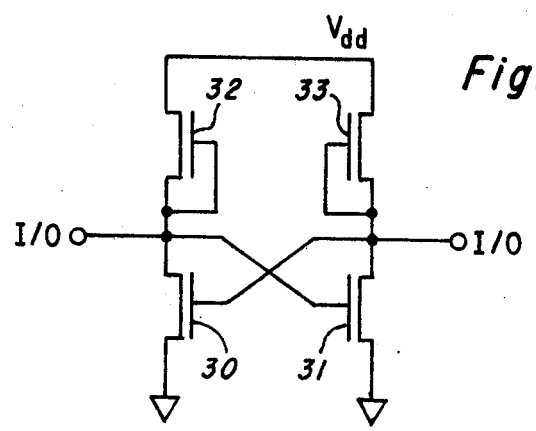

The concept of this invention can be used for other applications. For example, an array of MOS static RAM cells is made up of MOS flip-flop or bistable circuits. Each cell contains two driver transistors 30 and 31 and two load transistors 32 and 33 as seen in FIG. 4. The cell is considered to store a one when the transistor 31 is conducting or store a 0 if the transistor 30 is conducting, for example. One or more cells of an RAM array may be permanently programmed to always read 1 or 0 by implanting the transistors 31 or 30, respectively, as explained above. In one application of this concept, a RAM is included in a 16-bit microprocessor chip, and it has four 16-bit registers. One of the registers always contains a 15-bit address, and the remaining bit of this register should always be zero. Thus, the transistor 30 in this register has its channel implanted like the devices 25 above, so it will always be in the 0 static even if data is attempted to be written in.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory comprising:
   a. an array of rows and columns of memory cells on a face of a semiconductor body;
   b. an MOS transistor included in each of said memory cells, each MOS transistor having gate, source and drain regions and a channel region, insulator material above the channel region and beneath the gate being much thinner than surrounding insulator material on said face;
   c. selected ones of the channel regions of the MOS transistors being implanted with conductivity-detemining impuities to a depth much less than that of the source and drain regions and to an extent whereby the threshold voltage is substantially zero and the source and drain regions are essentially shorted together at zero volts on the gate, to thereby permanently program certain cells of the memory.

2. A semiconductor memory according to claim 1 wherein each cell is a read only cell.

3. A semiconductor memory according to claim 2 wherein the cells in a column are connected in series to provide an AND function output.

4. A semiconductor memory according to claim 3 wherein conductors define the rows of the array and provide gates of all MOS transistors in a row.

5. A semiconductor memory according to claim 4 wherein address circuitry is provided which applies a logic level, effective to turn on the MOS transistors, to all of said conductors except one.

6. A semiconductor memory according to claim 1 wherein the MOS transistors are N-channel silicon gate devices.

7. A method of programming a semiconductor memory comprising the steps of:
   a. providing a body of semiconductor material having an array of locations on a major face thereof which are the channel areas of MOS transistors;
   b. masking said one face with a meterial substantially impervious to an ion beam, apertures being defined in the material at selected ones of said locations where a selected logic level is to be permanently programmed;
   c. exposing said face to a beam of conductivity determining impurity atoms of an energy level and for a time sufficient to create an implanted region at each aperture to change the threshold voltage of the resulting MOS transistor to a voltage level of substantially zero;
   d. and thereafter forming a gate above each channel region separated therefrom by a thin gate oxide and forming source and drain regions for the MOS transistors and interconnections to provide an array of cells the source and drain regions being diffused to a depth much greater than the implanted regions.

8. A method according to claim 7 wherein the MOS transistors are N-channel silicon gate devices.

9. A method according to claim 8 wherein the array of cells is connected as a read only memory.

* * * * *